US007824187B1

(12) United States Patent
Yi

(10) Patent No.: US 7,824,187 B1
(45) Date of Patent: Nov. 2, 2010

(54) HIGH DENSITY CONNECTOR

(75) Inventor: Chong Yi, Mechanicsburg, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/587,341

(22) Filed: Oct. 5, 2009

(51) Int. Cl.
*H01R 12/00* (2006.01)
*H05K 1/00* (2006.01)

(52) U.S. Cl. ........................................................ 439/65

(58) Field of Classification Search .................. 439/65, 439/61, 62, 79, 607.08, 607.11, 607.06, 607.05, 439/607.07
See application file for complete search history.

(56) References Cited

U.S. PATENT DOCUMENTS 6,540,522 B2 4/2003 Sipe
7,322,856 B2 1/2008 Laurx et al.
2005/0048838 A1* 3/2005 Korsunsky et al. .......... 439/607

* cited by examiner

*Primary Examiner*—Javaid Nasri
(74) *Attorney, Agent, or Firm*—Ming Chieh Chang; Wei Te Chung; Andrew C. Cheng

(57) ABSTRACT

An electrical connector system comprises a first PCB assembly (100) comprising a first PCB (10) and a first electrical connector (20) mounted on said first PCB (10) and a second PCB assembly (300) comprising a second PCB (30) perpendicular to the first PCB (10) and a second electrical connector (40) mounted on said second PCB (30). The first electrical connector (20) is formed with a port and the second electrical connector (40) is also formed with a port matable into the port of the first electrical connector (20), so that the first PCB assembly (100) is mountable to the second PCB assembly (300) along a first direction (120) parallel to the first PCB (10) and the second PCB (30).

20 Claims, 14 Drawing Sheets

HIGH DENSITY CONNECTOR

CROSS-REFERENCE TO RELATED APPLICATIONS

This patent application is related to a pending U.S. patent application Ser. No. 12/148,757, filed on Apr. 22, 2008, and entitled "HIGH DENSITY CONNECTOR HAVING TWO-LEVELED CONTACT INTERFACE", which is assigned to the same assignee with this application.

BACKGROUND OF THE INVENTION

1. Field of the Invention

The present invention relates to a high-density connector and particularly to a connector for connecting PCBs orthogonal to each other.

2. Description of Related Art

U.S. Pat. No. 7,322,856, issued to Laurx ect. on Jan. 29, 2008, discloses a solution for connecting PCBs orthogonal to each other. However, the solution needs to use a mid-plane, which much increases the cost of the connector system. U.S. Pat. No. 6,540,522, issued to Sipe on Apr. 1, 2003, discloses another solution for connecting PCBs orthogonal to each other. While, the connector provided by Sipe has a number of circuit boards, which increases the cost of the connector system.

So there is a need for a new type of connector to connect orthogonal PCBs with the lower cost.

SUMMARY OF THE INVENTION

An object of the present invention is to provide an electrical connector for connecting orthogonal PCBs. The electrical connector comprises a plurality of stacked wafer units and a housing securing the wafer units. Each of the wafer units comprises a first wafer and a second wafer abutting to each other. Each of the first and the second wafers comprises a plurality of contacts and a first plastic insert fastening the contacts. Each of said contacts comprises a connecting end for mating with a complementary connector, a terminating end for mating with said PCB, and a middle portion connecting said connecting end to said terminating end. The connecting ends of the contacts are insert-molded in the first plastic insert. The first plastic insert of the first wafer forming a tongue beyond the first plastic insert of the second wafer thereof, said tongue having a side facing the second wafer and parallel to said PCB, the connecting end of each contacts of the wafer unit having a mating face facing away from said side of the tongue.

An object of the present invention is to provide another electrical connector for connecting orthogonal PCBs. The electrical connector comprises a plurality of stacked wafer units and a housing securing the wafer units. Each of the wafer units comprises a first wafer and a second wafer abutting to each other. Each of the first and the second wafers comprises a plurality of contacts and a plastic insert insert-molded with the plurality of contacts. Each of said contacts comprises a connecting end for mating with a complementary connector, a terminating end for mating with said PCB, and a middle portion connecting said connecting end to said terminating end. The plastic insert encapsulates the middle portion thereof, the connecting end extending from the plastic insert in a direction parallel to said PCB and the terminating end extending from the plastic insert towards said PCB. The plastic insert of the second wafer forms a tongue extending beyond the plastic insert of the first wafer in the same wafer unit, the tongue of the second wafer define a side perpendicular to said PCB and facing the first wafer, the connecting ends of the contacts of the wafer units having a mating face facing away from the side of said tongue thereof.

Other objects, advantages and novel features of the invention will become more apparent from the following detailed description of a preferred embodiment when taken in conjunction with the accompanying drawings.

DETAILED DESCRIPTION OF THE INVENTION

Figure 1:
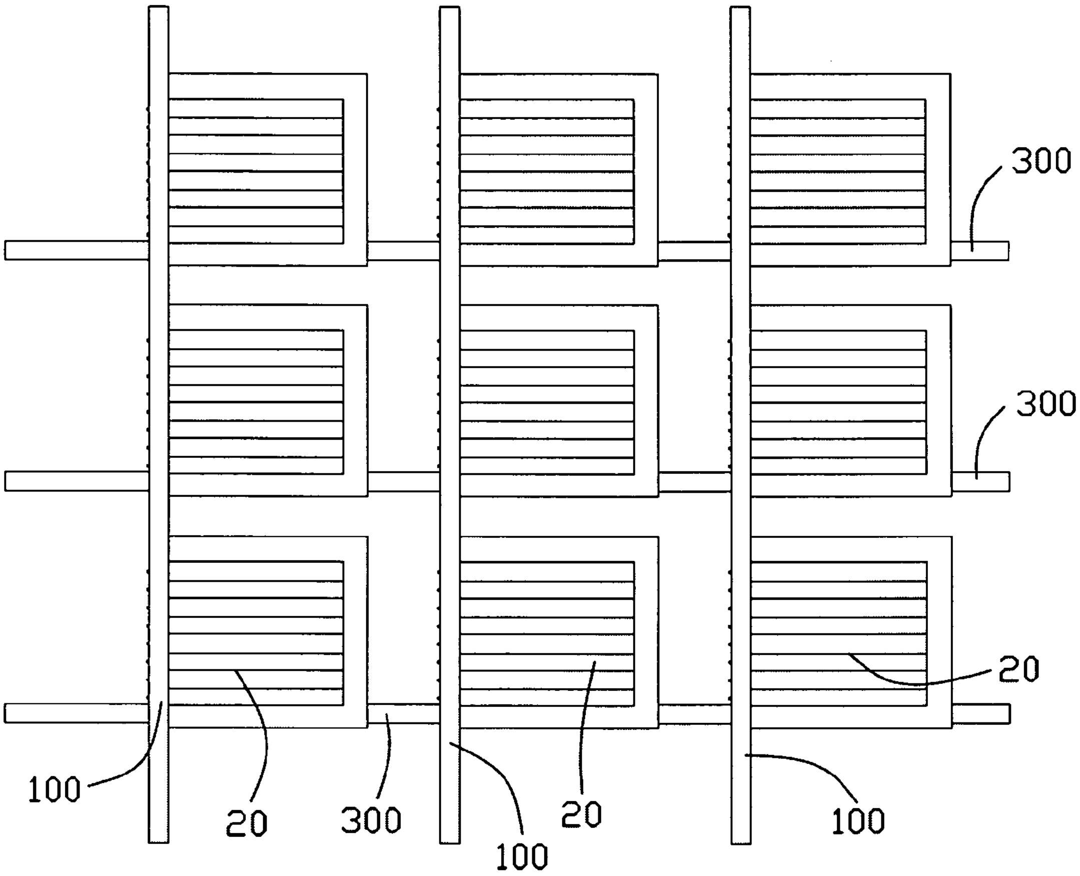
FIG. 1 is front view of an electrical connector system according to the present invention.

Reference will now be made to the drawing figures to describe the present invention in detail.

Referring to FIGS. 1-4, an electrical connector system according to an embodiment of the present invention is shown. The electrical connector system includes a plurality of first PCB assemblies 100 and a plurality of second PCB assemblies 300. Each of the first PCB assemblies 100 comprises a PCB 10 and a plurality of first electrical connectors 20 mounted thereon. Each of the second PCB assemblies 300 comprises a second PCB 30 and a plurality of second electrical connectors 40 mounted thereon. Each of the first PCBs 10 is arranged parallel to each other and perpendicular to each of the second PCBs 30. The first electrical connector 20 is formed with a first port and the second electrical connector 40 is formed with a second port matable into the first port of the first electrical connector 20 so that the first PCB assemblies 100 are mountable to the second PCB assemblies 300 along a first direction 120 parallel to the first PCB 10 and the second PCB 30. The first electrical connectors 20 and the second electrical connector 40 are arranged so that any selected one of said first PCBs 10 is connected to any selected one of said second PCBs 30 through a pair of mated first and second electrical connectors 20, 40.

In order to describe the invention in detail, only a pair of mated first and the second electrical connectors 20, 40 and a corresponding portion of the first and the second PCBs 10, 30 are shown in FIGS. 2-4 and 12.

Referring to FIGS. 5-8, 13 and 14, the first electrical connector 20 according to an embodiment of present invention is shown in detail. The first electrical connector 20 comprises an array of terminal pairs. Each terminal pair comprises a first terminal 22 and a second terminal 24 which are aligned along a second direction 130 perpendicular to the second PCB 30. Each of the first terminals 22 and the second terminals 24 has a middle portion 221, 241, a connecting end 222, 242 extending from the middle portion 221, 241 for mating with the second electrical connector 40, and a terminating end 224, 244 oppositely extending from the middle portion 221, 241. Each of the connecting ends 222, 242 has a mating face 223, 243 for contacting the second electrical connector 40. The mating face 223 of the first terminal 22 faces away from the second terminal 24 and the mating face 243 of the second terminal 24 faces toward the first terminal 22. The connecting ends 222, 242 of the first and second terminals 20, 40 of each terminal pair are spaced a distance from each other along the first direction 120. With the array of terminal pairs thus arranged, the density of the terminals 22, 24 in the second direction 130 may be increased.

In order to fasten the terminal pairs in position, a number of the first terminals 22 are firstly stamped from a metal plate and then are insert molded into a first plastic insert 220 to form a first wafer 202. A number of the second terminals 24 are stamped from another metal plate and are insert-molded into a second plastic insert 240 to form a second wafer 204. A first wafer 202 and an adjacent second wafer 204 consist of a wafer 200. The second plastic insert 240 abuts the first plastic insert 220 and forms a tongue 231 extending beyond the first plastic insert 220. The tongue further defines a number of recesses 232 to partially receive corresponding connecting ends 242 of the second wafer 204. The mating faces 223, 243 of each contact 22, 24 of the wafer 200 faces away from a same side of the tongue 231. There are several first wafer 202 and corresponding number of second wafer 204 which are alternately arranged.

The middle portion 241 of each second terminal 24 has a bent portion 233 bent towards the first terminal 22 and a connecting end 242 extends backwards to the middle portion 241 from the bent portion 233. The connecting end 242 of each second terminal 24 is molded in the tongue 231 with the mating face 243 exposed. The connecting ends 222, 242 of the terminal pairs in one wafer 200 insulated from the connecting ends 222, 242 of the terminal pairs in adjacent wafer 200 by the tongue 231.

The first electrical connector 20 further includes a first housing 26 fastening the wafers 200 in position. The first housing 26 defines a front cavity 260 and a rear cavity 269 and forms a middle wall 264 comparting the front cavity 260 from the rear cavity 269. The middle wall 264 extends perpendicular to the first PCB 10 and defines a number of slots 266. The wafers 200 are mounted in rear cavity 269 with the tongues 231 of the second wafers 204 and the connecting ends 222 of the first wafers 202 extending through corresponding slots 266 into the front cavity 260 for mating with the second electrical connector 40.

The first housing 26 forms a plurality of walls 262 surrounding the front cavity 260. The walls 262 provide alignment prior to the mating of the terminal modules 202, 204 with the second electrical connector 40.

Referring to FIGS. 9-14, the second electrical connector 40 according an embodiment of the present invention is shown in detail. The second electrical connector 40 comprises a plurality of wafer pieces 402-409. Each of the wafer pieces 402-409 includes a plurality of contacts 42-49 formed from a metal plate and a first plastic insert 522-529 molded with the contacts 42-49. Each of the contacts 42-49 has a connecting end 422 for mating with the first electrical connector 20, a terminating end 424 for mating with the second PCB, and a middle portion 421 connecting said connecting end 422 to said terminating end 424. Each of the connecting ends 422 of said wafer piece 402-409 is disposed in substantially planes parallel to the second PCB 30.

Adjacent two 402/403, 404/405, 406/407, 408/409 of the wafer pieces 402-409 respectively consist a wafer. Each of the wafers 402/403, 404/405, 406/407, 408/409 comprises a first wafer 402, 404, 406, 408 and a second wafer 403, 405, 407, 409. Each of the first plastic inserts 522, 524, 526, 528 of the first wafers 402, 404, 406, 408 has a tongue 520 extending beyond the first plastic insert 523, 525, 527, 529 of the second wafers 403, 405, 407, 409 in the same wafer. The tongue 520 defines a number of recesses 531 to receive corresponding connecting ends 432 of the contacts 43. The connecting ends 422, 432 of each contacts 42, 43 defines a mating face 423, 433 facing away from a same side of the tongue 520 for contacting corresponding mating face 223, 243 of the first and the second terminals 22, 23 of the first electrical connector 20 inserted therein.

The middle portion 421 of each first contact 42 has a portion 4211 bent towards the second contact 43 from a distal end of said middle portion 421 and then extending backwards to form the connecting ends 422. The connecting end 422 is molded in the tongue 520 with the mating face 423 exposed. The contacts 44, 45 of a wafer 404/405 are insulated from the contacts 42, 43 of an adjacent wafer 402/403 by the tongue 520 of the first plastic insert 524.

The mating face 423 of each contacts 42 of the first wafer 402 is substantially aligned to the mating face 433 of corresponding contact 43 of the second wafer 403 in the first direction 120 and spaced a distance from each other along the first direction 120 in the same wafer. This arrangement of the contacts 42-49 and terminals 22, 23 may improve the contact density for the first and the second electrical connectors 20, 40.

Each of said wafers 402-409, except for the one that is closest to the second PCB 30, further comprise a second plastic insert 542-548 fastening the terminal ends 422 of the contacts 42-48 and separated from the first plastic insert 522. The middle portion 421 is bent between the first and the second plastic insert 522, 542 so that the contact 42-49 is formed into an "L" shape. The contact module 409 closest to the second PCB 30 has no need to design a second plastic to further position the terminal ends of the second contacts 49. The second plastic insert 542, 543 of the first and the second wafers 402, 403 abuts each other so that the terminating ends 422, 432 are located in predetermined positions.

The second electrical connector 40 further comprises a second housing 66 for fastening the wafers 402-409. The second housing 66 defines a front cavity 660 and a rear cavity 669 and a middle wall 664 computing said front cavity 660 from the rear cavity 669. The middle wall 664 defines a plurality of slots 666 so that the first wafers 402 and the second wafers 403 can be mounted in rear cavity 669 with the tongues 520 of the first wafers 402 and the connecting ends

432 of the second wafers 403 extending through corresponding slots 666 into the front cavity 660 for mating with the first electrical connector 20.

Each of first plastic inserts 522, 524, 526, 528 forms a plurality of protrusions 521 abutting behind the bent portion 431 of the second wafers 403, 405, 407, 409, so that the protrusions 521 may provide a force to the contact 43, 45, 47, 49 when the wafers is inserted into the second housing 66.

The second housing 66 forms a plurality of positioning walls 65 extending backwards from the middle wall 664, a plurality of receiving slot 650 being defined for receiving the second contacts 43 and the protrusions 521 of the first plastic insert 522.

The second housing 66 forms a plurality of walls 662 defining the front cavity 660 for receiving the complementary connector 20. The walls 662 provide alignment prior to the mating of the terminal modules 402-409 with the complementary connector 20.

Figure 11:
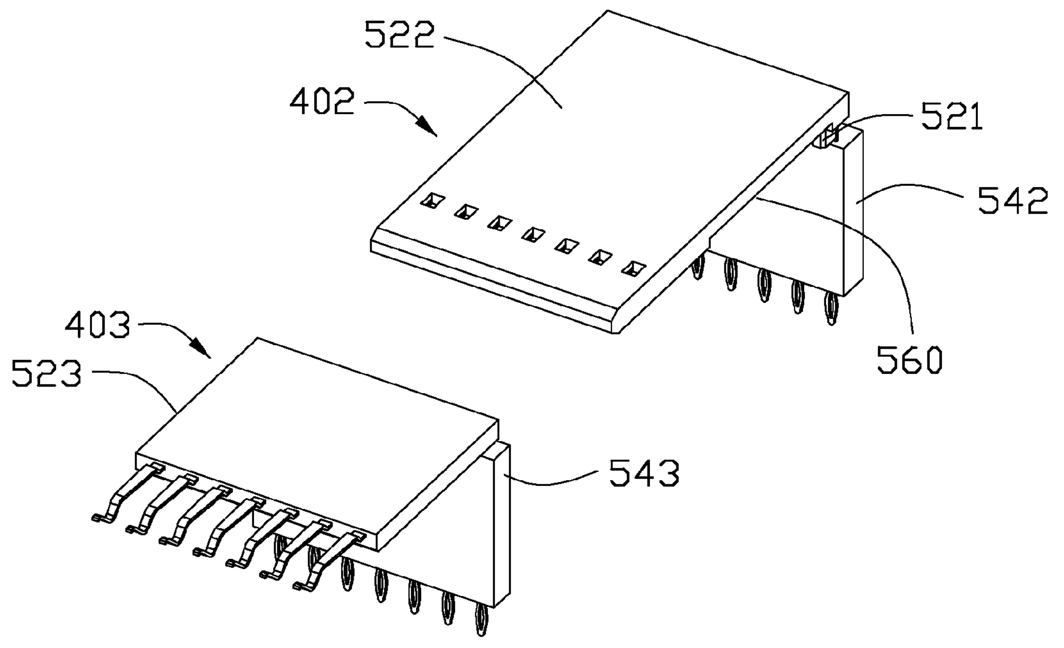
FIG. 11 is a exploded view showing a wafer of the second electrical connector.
Figure 12:
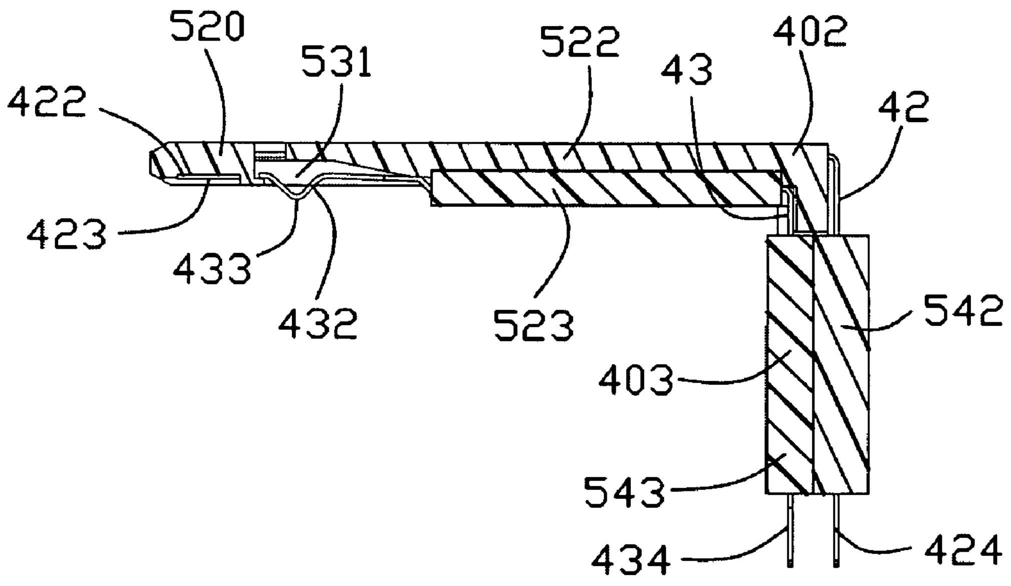
FIG. 12 is a cut-open view showing a wafer of the second electrical connector.

Additionally, some features of the invention are described in more detail in the following. Referring to FIGS. 11 and 12, the first plastic insert 522 of the first wafer 402 defines a slot 560, the first plastic insert 523 of the second wafer 403 in the same wafer unit mating into said slot 560. Referring to FIGS. 3, 9, 10 and 14, the housing 66 forms a plurality of positioning walls 65 extending backwards from the middle wall 666, a plurality of receiving slot 650 being defined at an rear end of the positioning walls 65 receiving the second contacts 43, 45, 47 and 49 and the protrusions 521 of the first plastic insert 522.

Figure 2:
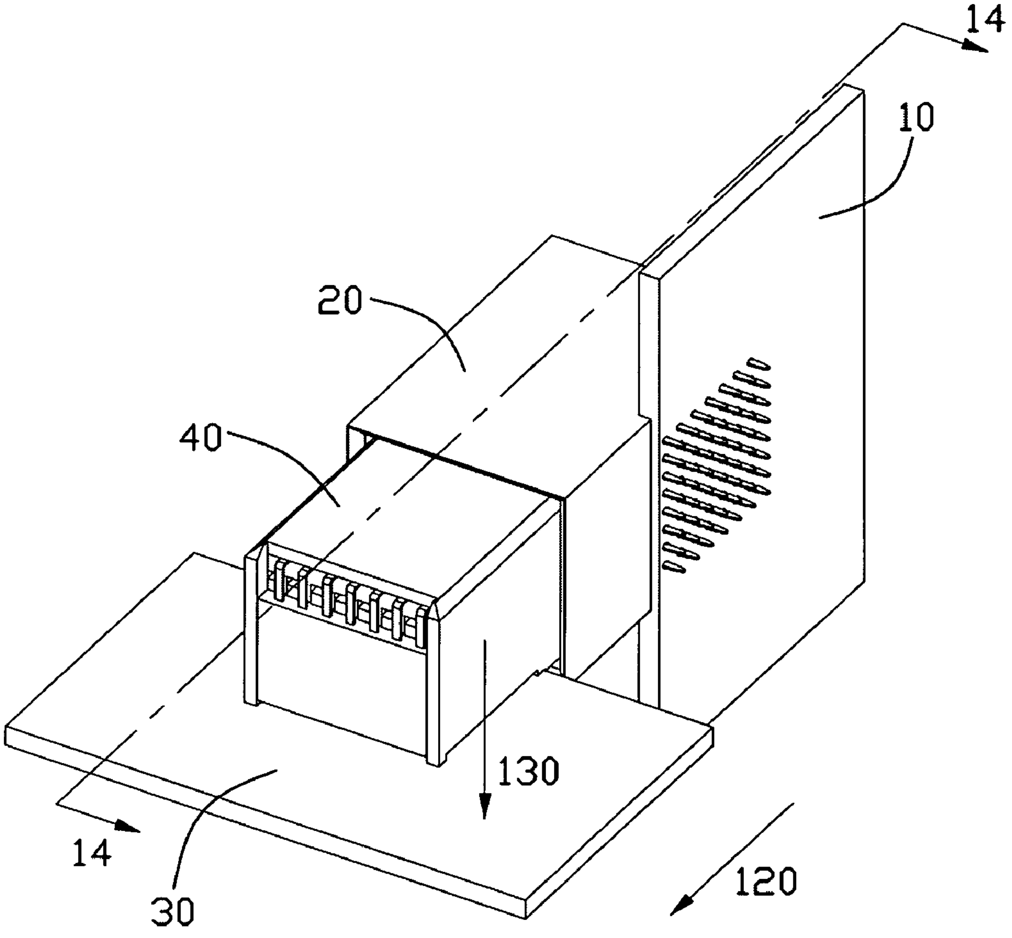
FIG. 2 is perspective view of a portion of the electrical connector system including only a first and a second electrical connectors in a mated state and portions of a first and a second PCBs.
Figure 3:
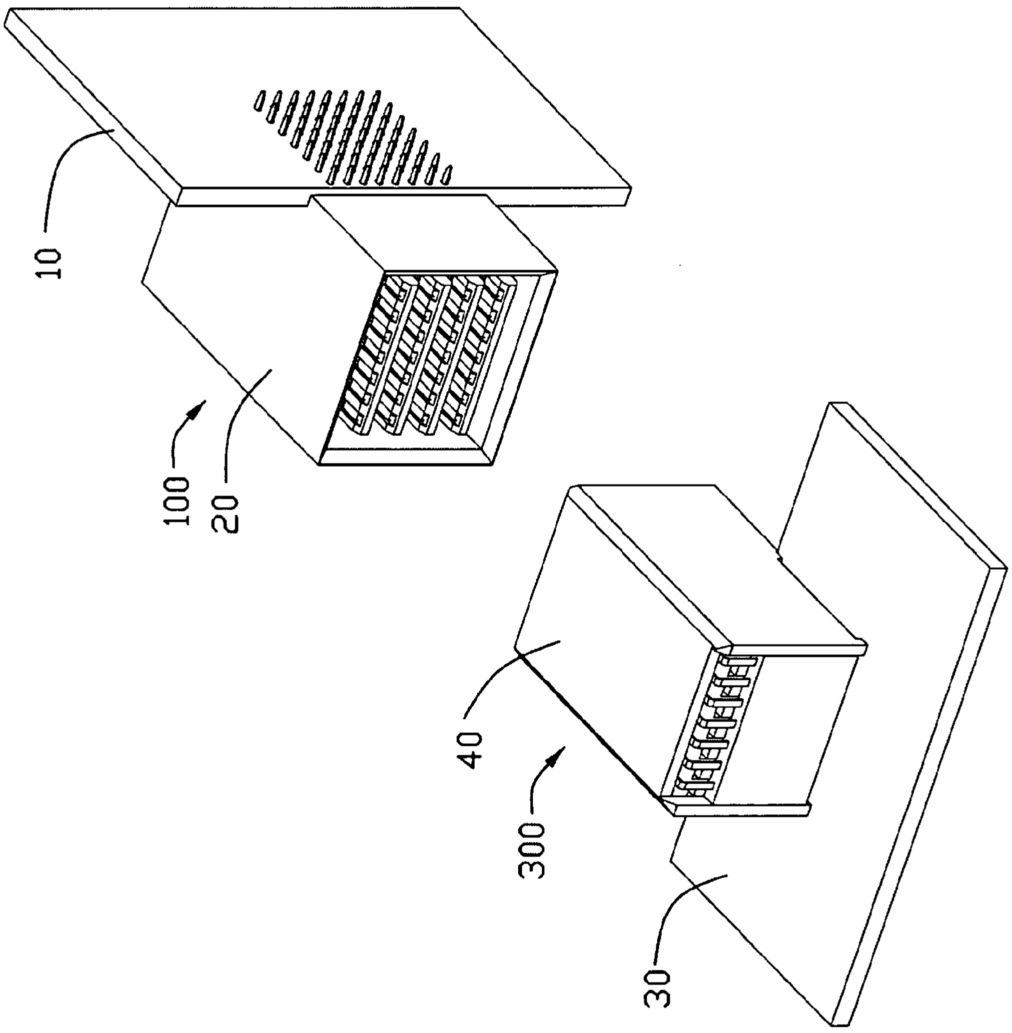
FIG. 3 is a perspective view of the portion of the electrical connector system shown in FIG. 2 with the first and the second electrical connector in an unmated state.
Figure 4:
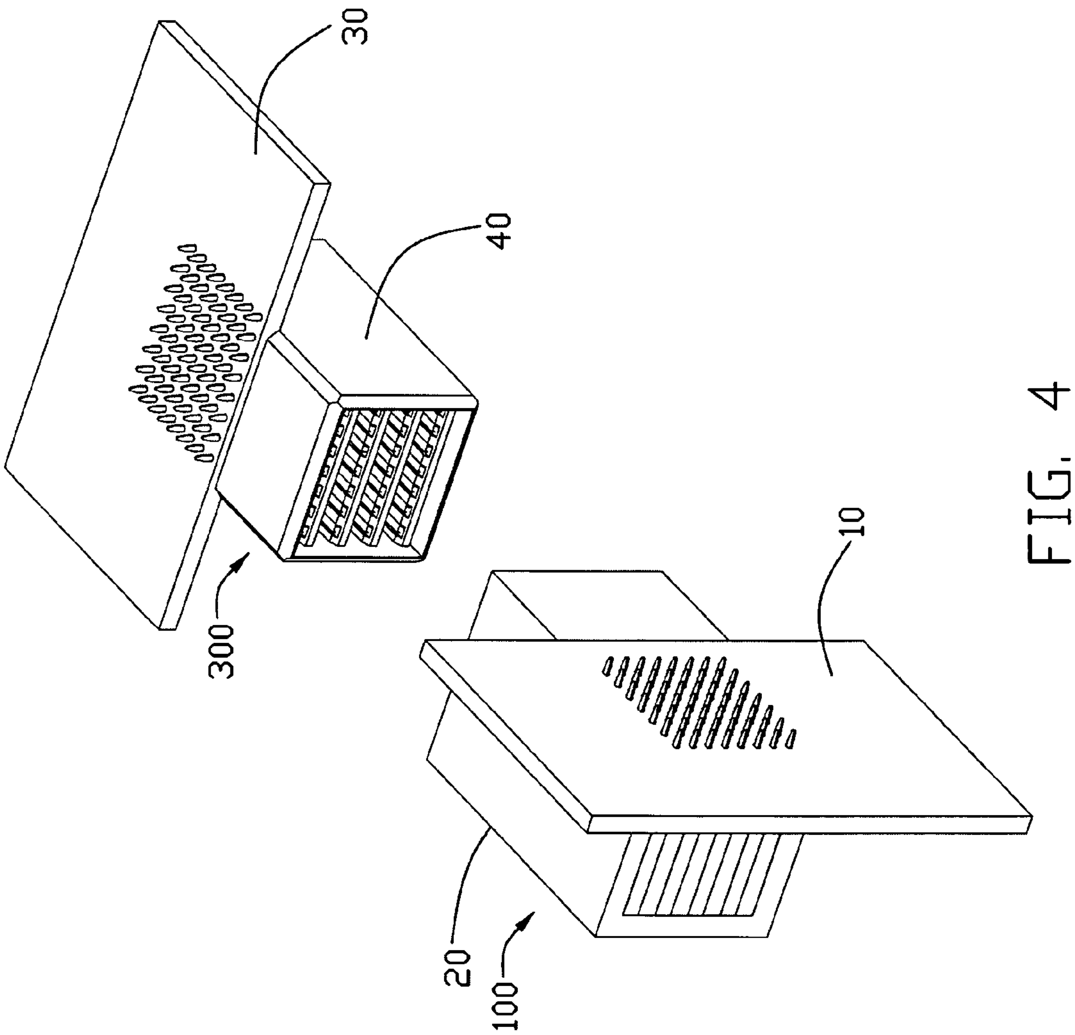
FIG. 4 is another perspective view of the portion of the electrical connector system shown in FIG. 2 with the first and the second electrical connector in an unmated state.
Figure 5:
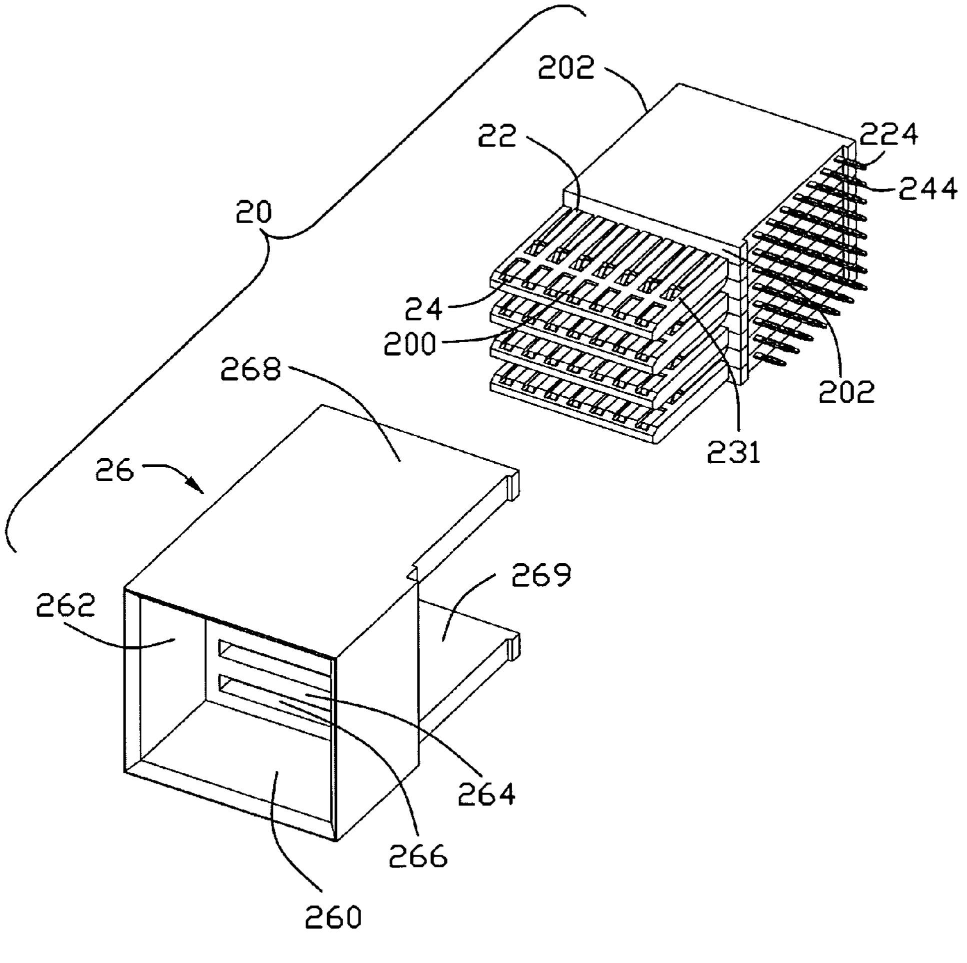
FIG. 5 is a partially exploded view of the first electrical connector.
Figure 6:
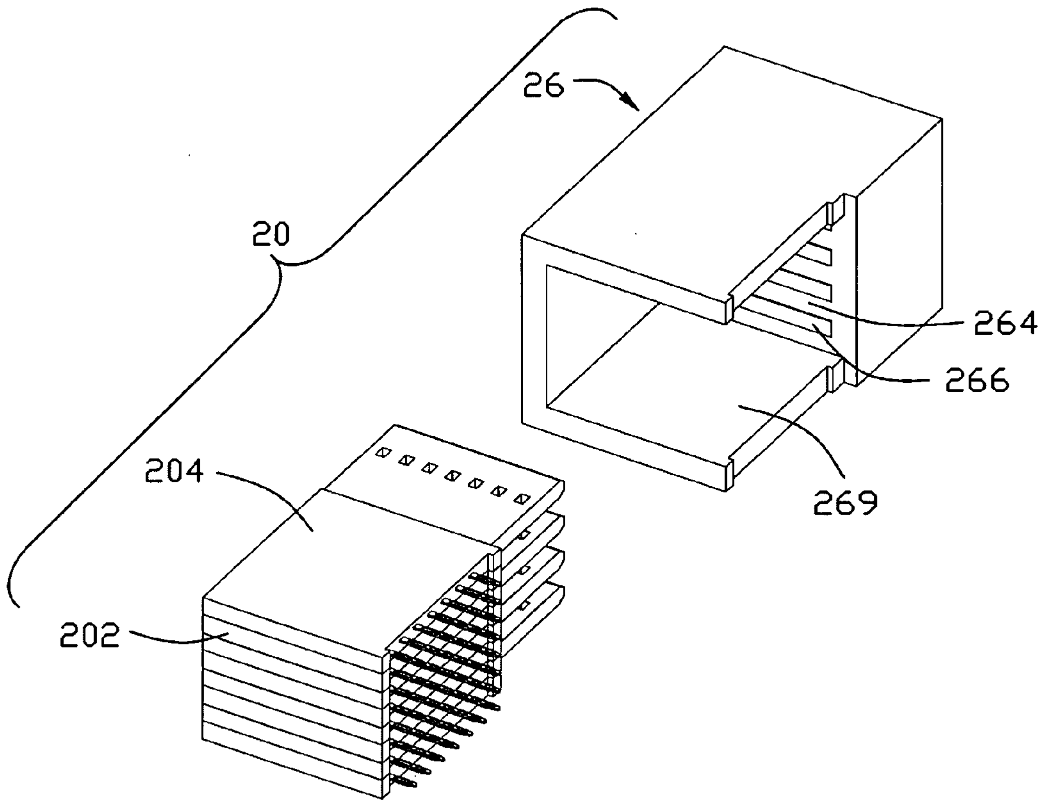
FIG. 6 is another partially exploded view of the first electrical connector.
Figure 7:
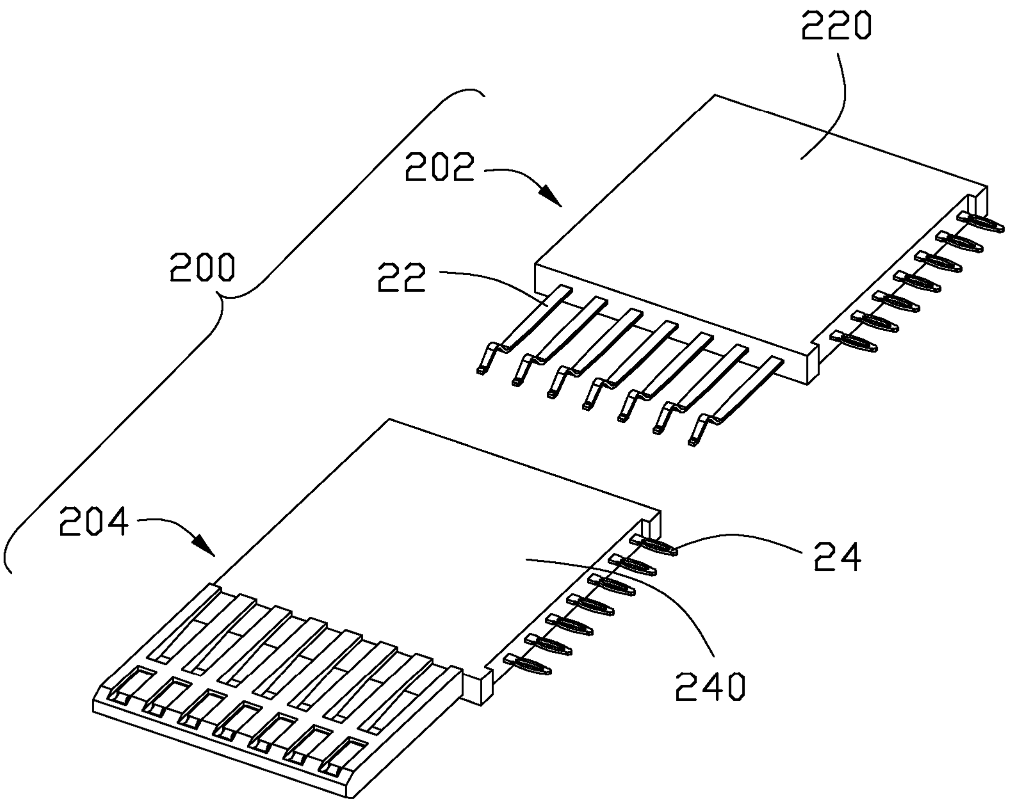
FIG. 7 is a perspective view showing the terminal modules of the first electrical connector.
Figure 8:
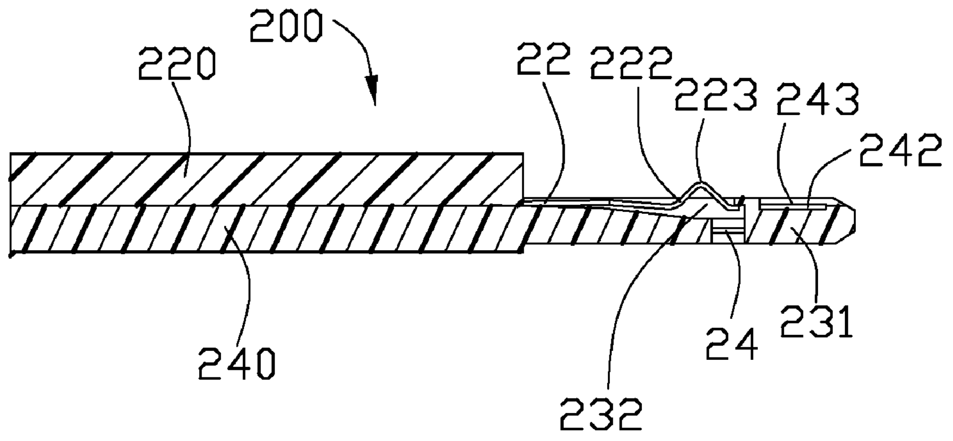
FIG. 8 is a cut-open view showing a wafer of the first electrical connector.
Figure 9:
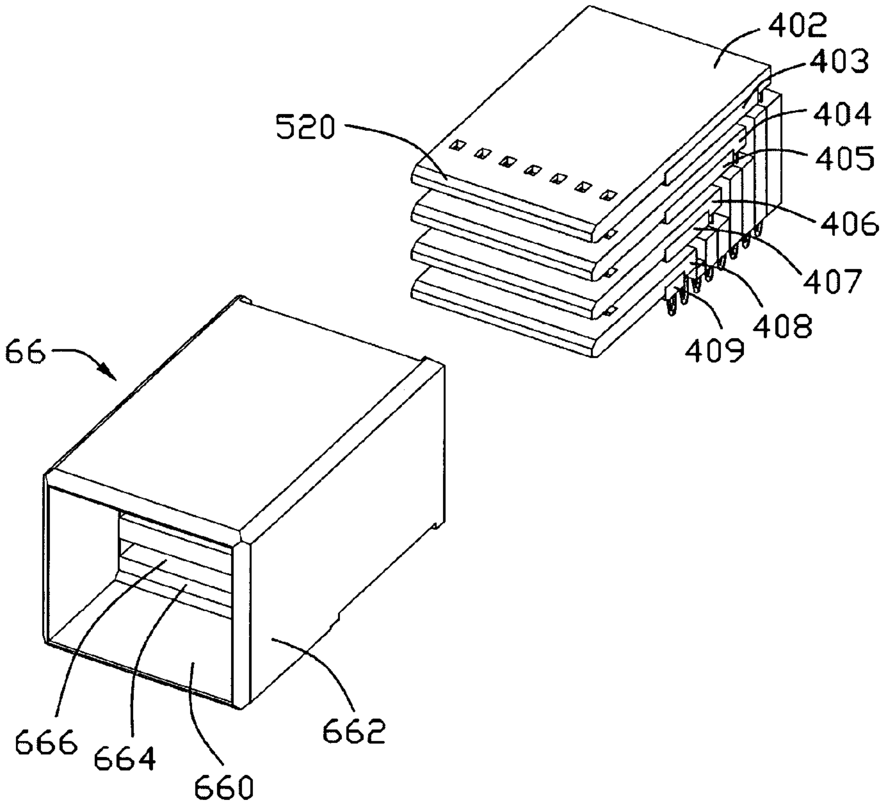
FIG. 9 is a partially exploded view of the second electrical connector.
Figure 10:
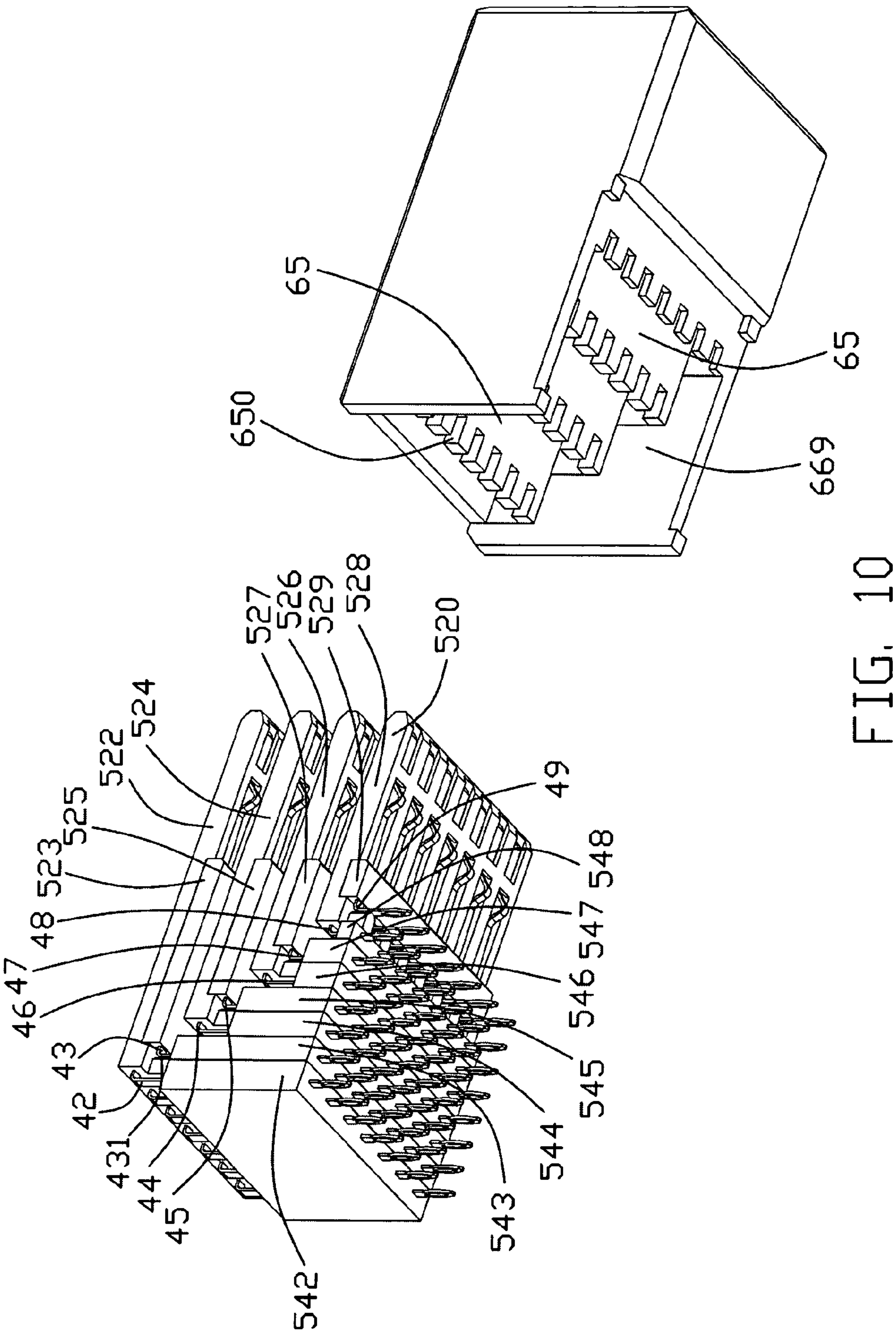
FIG. 10 is another partially exploded view of the second electrical connector.
Figure 13:
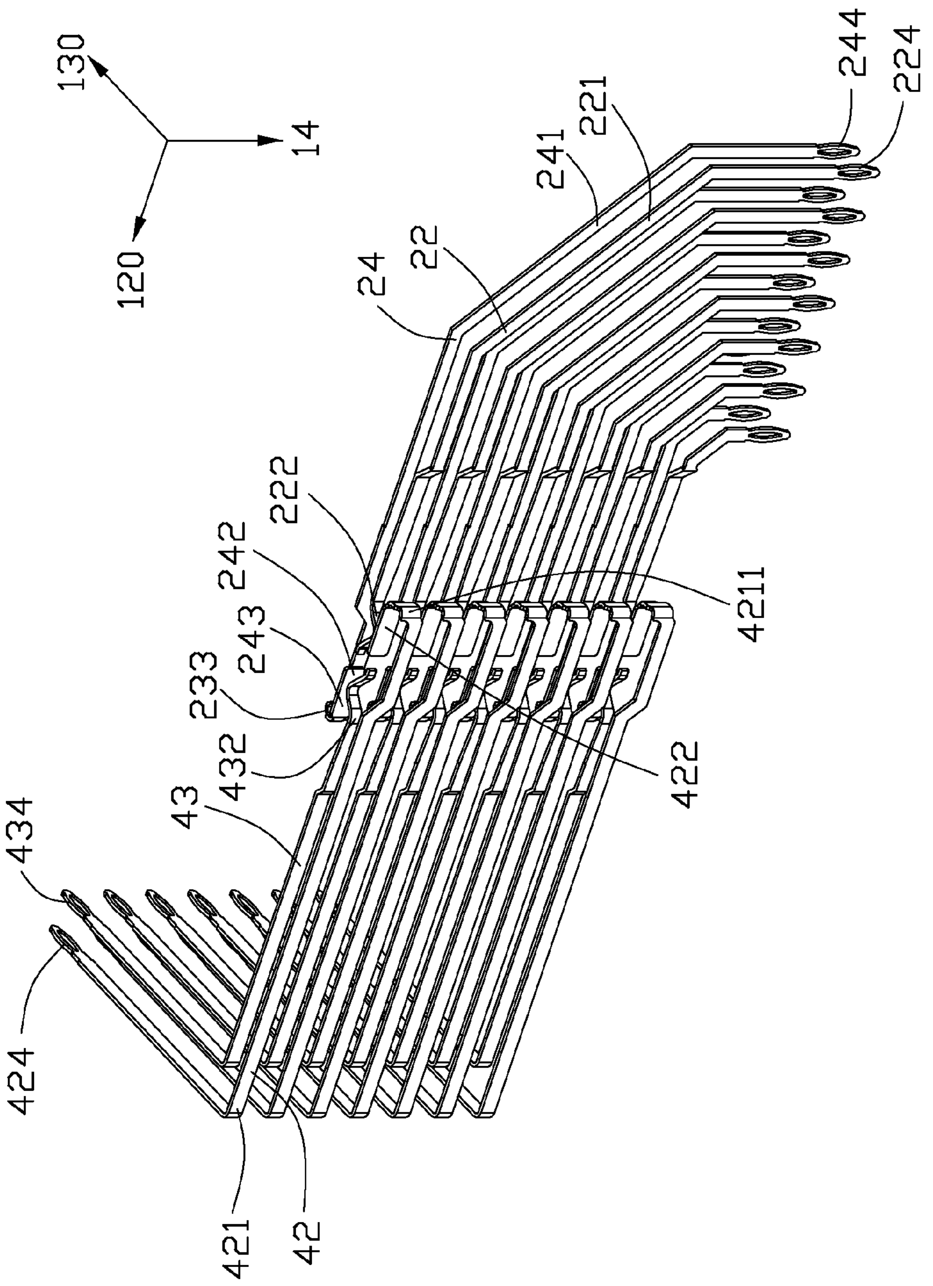
FIG. 13 is a perspective view showing the mating of a wafer of the first electrical connector and a wafer of the second electrical connector (the plastic inserts being removed for clearer shown)
Figure 14:
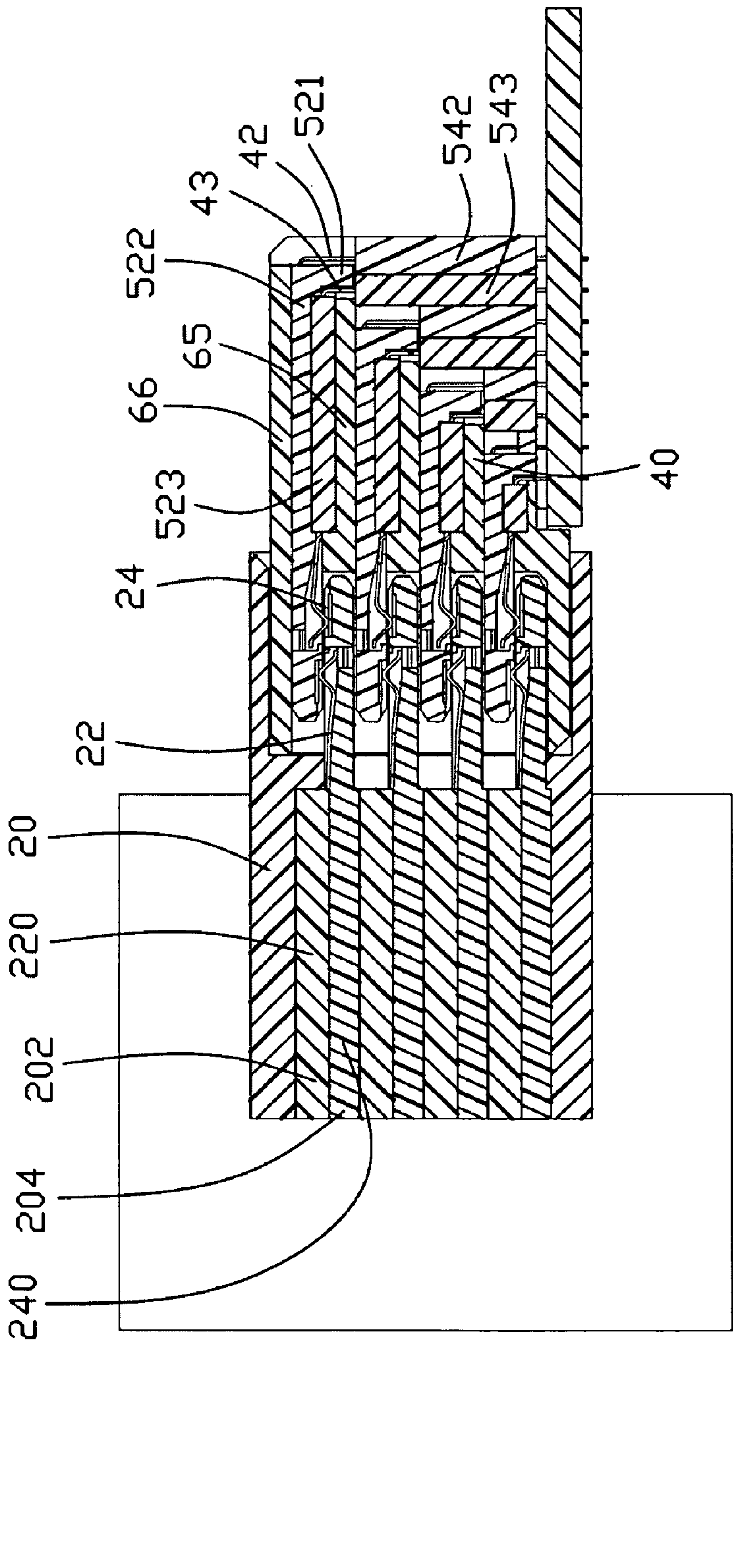
FIG. 14 is a cutaway view of the portion shown in FIG. 2 taken along 14-14.

Referring to FIGS. 2 and 13, the present invention is summarized in a different way in this paragraph. An electrical connector assembly comprises a first connector 40, a plurality of first resilient contacts 43, a plurality of first stiff contacts 42, a second connector 20, a plurality of second resilient contacts 22, and a plurality of second stiff contacts 24. The first connector 40 defines a first mating port and a first mounting port. Each of the plurality of first resilient contacts 43 has a first resilient contacting section 432 exposed in the first mating port and juxtaposed with one another along a transverse direction 14, and a first mounting section 434 exposed in the first mounting port and juxtaposed along said transverse direction 14 with one another. Each of the plurality of first stiff contacts 42 has a first stiff contacting portion 422 juxtaposed along said transverse direction 14 and exposed in the first mating port and in back of the first resilient contacting section 432 of the corresponding first resilient contact 43 along a front-to-back direction 120 perpendicular to said transverse direction 14, and a first mounting portion 424 exposed in the first mounting port and juxtaposed along said transverse direction 14 with one another. The second connector 20 defines a second mating port and a second mounting port. Each of the plurality of second resilient contacts 22 includes a second resilient contacting section 222 exposed in the second mating port and juxtaposed along said transverse direction 14 with one another, and a second mounting section 224 exposed in the second mounting port and juxtaposed along said front-to-back direction 120 with one another. Each of the plurality of second stiff contacts 24 includes a second stiff contacting portion 242 exposed in the second mating port in front of the second resilient contacting section 222 along said front-to-back direction 120 and juxtaposed along said transverse direction 14 with one another, and a second mounting portion 244 exposed in the second mounting port and juxtaposed along said front-to-back direction 120 with one another.

The disclosure is illustrative only, changes may be made in detail, especially in matter of shape, size, and arrangement of parts within the principles of the invention.

What is claimed is:

1. An electrical connector to be mounted on a PCB comprising:

a plurality of stacked wafer units and a housing securing the wafer units, each of the wafer units comprising a first wafer and a second wafer abutting to each other, each of the first and the second wafers comprising:

a plurality of contacts, each of said contacts comprising a connecting end for mating with a complementary connector, a terminating end for mating with a PCB, and a middle portion connecting said connecting end to said terminating end, and a first plastic insert fastening the connecting ends of the contacts, wherein the first plastic insert of the first wafer forming a tongue beyond the first plastic insert of the second wafer thereof, said tongue having a side facing the second wafer and parallel to said PCB, the connecting end of each contact of the wafer unit having a mating face facing away from said side of the tongue in the same wafer unit.

2. An electrical connector as claimed in claim 1, wherein each of the first and the second wafers further comprises a second plastic insert positioning the terminal ends of said contacts.

3. An electrical connector as claimed in claim 2, wherein the first plastic insert is insert-molded with the connecting ends and the second plastic insert is insert-molded with the terminal ends of the contacts thereof.

4. An electrical connector as claimed in claim 3, wherein the middle portions of the contacts of each of the first wafers and the second wafers has a portion exposed between the first and the second plastic inserts and bent with a right angle thereof.

5. An electrical connector as claimed in claim 4 further comprising a second wafer unit which is closest to said PCB, said second wafer unit further comprising a wafer having a plurality of contacts and only one plastic insert fastening said plurality of contacts.

6. An electrical connector as claimed in claim 1 further comprising a plastic positioning the terminating ends of the contacts.

7. An electrical connector as claimed in claim 1, wherein the housing forms a plurality of walls defining a front cavity for receiving the complementary connector, said walls providing alignment prior to the mating of the contacts of said plurality of wafer units with the complementary connector.

8. An electrical connector as claimed in claim 1, wherein the first plastic insert of the first wafer defines a slot, the first plastic insert of the second wafer in the same wafer unit mating into said slot.

9. An electrical connector as claimed in claim 1, the housing defining a front cavity and a rear cavity and forming a middle wall perpendicular to the second PCB, the middle wall separating said front cavity from the rear cavity, the middle wall defining a plurality of slots, the first wafers and the second wafers being mounted in rear cavity with the tongues of the first wafers and the connecting ends of the second wafers extending through corresponding slots and getting into the front cavity for mating with the complementary connector.

10. An electrical connector as claimed in claim 9, wherein each of the first plastic insert of the first wafers forms a plurality of protrusions abutting behind the middle portion of corresponding second contact, so that the protrusions could provide a force to the middle portion of the second contact.

11. An electrical connector as claimed in claim 10, wherein the housing forms a plurality of positioning walls extending backwards from the middle wall, a plurality of receiving slot being defined at an rear end of the positioning walls and receiving the second contacts and the protrusions of the first plastic insert.

12. An electrical connector as claimed in claim 1, wherein the middle portion of each contacts of the first wafer has a portion bent rearwards and the connecting ends extends backwards continually therefrom, said connecting end being molded in the tongue with the mating face exposed on a side of the tongue, the connecting ends of the contacts of the second wafer extending towards the connecting ends of the contacts of the first wafer.

13. An electrical connector to be mounted on a PCB comprising:

a plurality of stacked wafer units, each of the wafer units comprising a first wafer and a second wafer abutting to each other, each of the first and the second wafers comprising:

a plurality of contacts, each of said contacts comprising a connecting end for mating with a complementary connector, a terminating end for mating with a PCB, and a middle portion connecting said connecting end to said terminating end, and a plastic insert encapsulating the middle portion, the connecting end extending from the plastic insert in a direction parallel to said PCB and the terminating end extending from the plastic insert towards said PCB, a housing securing the wafer units;

wherein the plastic insert of the second wafer forming a tongue extending beyond the plastic insert of the first wafer in the same wafer unit, the tongue of the second wafer define a side perpendicular to said PCB, the connecting end of each of the contacts of the first and the second wafers having a mating face facing away from said side of the tongue thereof.

14. An electrical connector as claimed in claim 13, wherein the housing forms a plurality of walls defining a front cavity for mating with the complementary connector, said walls providing alignment prior to the mating of the contact with the complementary connector.

15. An electrical connector assembly comprising:

a first connector defining a first mating port and a first mounting port;

a plurality of first resilient contacts each having a first resilient contacting section exposed in the first mating port and juxtaposed with one another along a transverse direction, and a first mounting section exposed in the first mounting port and juxtaposed along said transverse direction with one another;

a plurality of first stiff contacts each having a first stiff contacting portion juxtaposed along said transverse direction and exposed in the first mating port and in back of the first resilient contacting section of the corresponding first resilient contact along a front-to-back direction perpendicular to said transverse direction, and a first mounting portion exposed in the first mounting port and juxtaposed along said transverse direction with one another;

a second connector defining a second mating port and a second mounting port;

a plurality of second resilient contacts each including a second resilient contacting section exposed in the second mating port and juxtaposed along said transverse direction with one another, and a second mounting section exposed in the second mounting port and juxtaposed along said front-to-back direction with one another;

a plurality of second stiff contacts each including a second stiff contacting portion exposed in the second mating port in front of the second resilient contacting section along said front-to-back direction and juxtaposed along said transverse direction with one another, and a second mounting portion exposed in the second mounting port and juxtaposed along said front-to-back direction with one another.

16. An electrical connector assembly as claimed in claim 15, wherein said second resilient contacts are located in a first plane defined along said transverse direction and said front-to-back direction.

17. An electrical connector assembly as claimed in claim 16, wherein said second stiff contacts are located in a second plane defined along said transverse direction and said front-to-back direction and spaced from the first plane in a parallel relation with a distance in a vertical direction perpendicular to both said transverse direction and said front-to-back direction.

18. An electrical connector assembly as claimed in claim 15, wherein the first resilient contacting sections are essentially located in a first plane defined along the transverse direction and the front-to-back direction while the first mounting sections are essentially located in a second plane defined along said transverse direction and a vertical direction perpendicular to both said transverse direction and said front-to-back direction.

19. An electrical connector assembly as claimed in claim 18, wherein the first stiff contacting portions are essentially in said first plane while the first mounting portions are essentially located in a third plane defined along said transverse direction and said vertical direction and spaced from the second plane in a parallel relation with a distance along said front-to-back direction.

20. An electrical connector assembly as claimed in claim 15, wherein both said first mounting sections and said first mounting portions are configured to be mounted to a first printed circuit board extending in a first plane defined along said transverse direction and said front-to-back direction while both said second mounting sections and said second mounting portions are configured to be mounted to a second printed circuit board extending in a second plane defined along said front-to-back direction and a vertical direction perpendicular to both said transverse direction and said front-to-back direction under condition that said second plane is perpendicular to said first plane.

* * * * *